United States Patent [19]

Yamamura

[11] Patent Number: 5,027,252
[45] Date of Patent: Jun. 25, 1991

[54] SEMICONDUCTOR INPUT PROTECTION DEVICE

[75] Inventor: Ryuji Yamamura, Tokyo, Japan

[73] Assignee: NEC Corporation, Tokyo, Japan

[21] Appl. No.: 596,452

[22] Filed: Oct. 12, 1990

[30] Foreign Application Priority Data

Oct. 12, 1989 [JP] Japan .................................. 1-266943

[51] Int. Cl.$^5$ ............................................. H02H 9/04
[52] U.S. Cl. ....................................... 361/58; 361/91; 357/23.13
[58] Field of Search ..................... 361/56, 58, 111, 91; 357/23.13

[56] References Cited

U.S. PATENT DOCUMENTS

| 4,385,337 | 5/1983 | Asano et al. | 361/91 |
| 4,527,213 | 7/1985 | Ariizumi | 357/23.13 |
| 4,578,694 | 3/1986 | Ariizumi et al. | 357/23.13 |
| 4,605,980 | 8/1986 | Hartranft et al. | 361/91 |
| 4,609,931 | 9/1986 | Koike | 357/23.13 |

Primary Examiner—Todd E. DeBoer
Attorney, Agent, or Firm—Sughrue, Mion, Zinn, Macpeak & Seas

[57] ABSTRACT

A semiconductor input protection device is disclosed which comprises a well type punch-through transistor consisting of a pair of parallel-opposed well layers through intermediation of a field oxide film, one of which is connected to an input terminal and the other to a reference potential. The device further comprises an impurity diffusion layer resistance with an end thereof connected to the input terminal. The lower limit distance between the opposed sides of the well layers to each other and the channel stopper is set to be smaller than that between the channel stopper and the input terminal-side well layer in the area where the latter and the impurity diffusion layer resistance intersect. The two lower limit distances depend on punch-through voltage, the width of the depletion layer in the well layer at applied punch-through voltage, and the junction disruptive strength of the well layer.

48 Claims, 6 Drawing Sheets

SEMICONDUCTOR INPUT PROTECTION DEVICE

BACKGROUND OF THE INVENTION

1. Field of the Invention

This invention relates to a semiconductor device with input protection circuit for protecting it from external surge due to static charge into the input terminal.

2. Description of the Prior Art

Semiconductor devices, especially MOS ICs and Bi-CMOS ICs, have a gate insulating film consisting of a silicon oxide film extremely thin between about 20 and about 30 nm in thickness. This may be cause that external static charge and noise easily brings about breakdown in the gate-insulating film. It therefore is essential to provide a semiconductor device with a semiconductor input protection device.

An early type of semiconductor input protection device was provided with an input protection resistance between input terminal and internal circuit, and thereby external surge was modified according to the time constant determined by the value of the input protection resistance and the stray capacity associated with the input protection resistance, and others.

As the next-generation type of semiconductor input protection device, combined use of input protection resistance and protective MOS transistor came. The protective MOS transistor had a protective-function capacity instead of the stray capacity. Besides it effected the function of letting surges of 20 V or higher pass to the ground. Protective MOS transistor can be grouped into two types: In the first, the drain and the gate electrode are connected to the input terminal and the source to the ground, and the field oxide film is used instead of the gate insulating layer. (The first type protective MOS transistor is referred to as $V_{T2}$ type transistor, hereinafter.) The second type has the same in structure as a MOS transistor constituting an internal circuit component, in which the drain is connected to the input terminal, and the source and the gate electrode to the ground. (The second type protective MOS transistor is referred to as $V_{DS}$ type transistor, hereinafter.) A typical semiconductor input protective device comprising these protective elements was constructed as follows: the input terminal was connected to the first terminal of the first impurity diffusion layer resistance, which was a first input protective resistance, and to the gate electrode of a $V_{T2}$ type transistor. The second terminal of the first impurity diffusion layer resistance was connected to the first terminal of the second impurity diffusion layer resistance, which was a second input protective resistance, and to the drain of a $V_{T2}$ type transistor. The second terminal of the second impurity diffusion layer resistance was connected to the drain of the $BV_{DS}$ type transistor and to the internal circuit. The sources of $V_{T2}$ type and $BV_{DS}$ type transistors and the gate electrode of the $BV_{DS}$ type transistor were connected to the grounded wire. In this case, however, a MOS transistor of a small current capacity was used for letting external surge to pass to the ground, and therefore a part of external surge to pass to the ground, and therefore a part of external surge, when large, was allowed occasionally to reach the internal circuit.

Thus recently punch-through transistor large in current capacity has become used as a protective component in semiconductor input protection devices. The punch-through transistor functions to clamp relatively large surges while conventional protective elements serve against relatively small ones.

A semiconductor input protection device of such type is exemplified in U.S. Pat. No. 4,819,046 (corresponding to Japanese Patent Laid-Open Application No. Sho. 62-274664) in which a punch-through transistor consisting of a pair of impurity diffusion layers is interposed between the first terminal of the first impurity diffusion layer resistance, a first input protection resistance, and the input terminal. This punch-through transistor is constructed as follows: The first impurity diffusion layer is connected to the input terminal, the second impurity diffusion layer is connected to a ground or power supply potential node. A field oxide film is formed on the semiconductor substrate comprising the first and second impurity diffusion layers which are adjacent to a channel stopper and formed simultaneously with the first input protection resistance and the source and drain of a MOS transistor in the internal circuit.

In the punch-through transistor like this, the first and second impurity diffusion layers contact with the channel stopper, and therefore when external surge is input into the first impurity diffusion layer, the depletion layer of the first impurity diffusion layer in the region of the semiconductor substrate between the first and second impurity diffusion layers (the channel region of the punch-through transistor) results, in turn, in greater extension in the inside of the semiconductor substrate than at the interface between the semiconductor substrate and the field oxide film, and in higher punch-through current density in the inside of the substrate than at the interface than. Thus more incomplete crystallization at the interface due to large current is avoidable, that is, this construction does not allow the punch-through current to be a cause of interfacial leakage. On the other hand, the formation of p-n junctions where the first and second impurity diffusion layers and the channel stopper contact with each other gives a tendency toward local occurrence of junction breakdown due to external surge especially in the surrounding of the first impurity diffusion layer. Local junction breakdown, if it occurs, would result in injection of hot carriers into the field oxide film surrounding the first impurity diffusion layer, and in reduction of the depletion layer in the first impurity diffusion layer locally at the interface of the semiconductor substrate adjacent to the injected portion. Thus, still after external surge has passed into the semiconductor substrate, tendency toward local leakage remains in the affected portion. Once such situation comes, it can function as a semiconductor input protection device against external surge but normal inputs into the internal circuit from the input terminal would be inhibited by such leakage.

Another example of semiconductor input protection device with a punch-through transistor is disclosed in Japanese Patent Laid-Open Application No. Hei. 1-194474, in which a well-type punch-through transistor consisting of a pair of wells is connected to the input terminal. This is a proposal for solving the problem with the injection of hot carriers into the field oxide film surrounding the first impurity diffusion layer, resulting from junction breakdown, and its construction is as follows: The first impurity diffusion layer connected to the input terminal is formed in the first well layer, and the second impurity diffusion layer connected to a ground node is formed in the second well layer. The first and second well layers are defined at specified distances from the channel stopper. Somewhere except the connection point of the input terminal with the well-type punch-through transistor, the internal circuit is connected to the input terminal through the first impurity diffusion layer resistance, and others. The first well layer is defined at a specified distance from the channel stopper, and thereby junction disruptive strength of the first well layer is higher than that of the first impurity diffusion layer resistance. If external surge passes into the input terminal, this would not allow junction breakdown to occur in the well-type punch-through transistor to occur, it can occur in the first impurity diffusion layer resistance. Besides the well-type punch-through transistor is high in punch-through voltage and current compared with the first example.

A problem of this semiconductor input protection device however resides in that the area required for the input terminal is larger than the above-mentioned first example of input protection device, this resulting from that the connection between the first impurity diffusion layer resistance connecting to the internal circuit and the input terminal is made somewhere other than the connection point between the well-type punch-through transistor and the input terminal. Another problem with this input protection device is that owing to the absence of channel stopper between the first and second well layers in the semiconductor substrate, punch-through current density is uniform in the longitudinal direction, resulting, in turn, in larger current-flow also at the substrate interface, more incomplete crystallization at the substrate interface, and tendency toward interfacial leakage.

BRIEF SUMMARY OF THE INVENTION

Objects of the Invention

It is an object of the invention to provide a semiconductor input protection device in the semiconductor device.

Another object of the invention is to provide a semiconductor input protection device in MOS IC.

A further object of the invention is to provide a semiconductor input protection device in BI-CMOS.

A further object of the invention is to provide a semiconductor input protection device with a punch-through transistor.

A further object of the invention is to provide a semiconductor input protection device with a well-type punch-through transistor.

A further object of the invention is to provide a semiconductor input protection device with a well-type punch-through transistor for letting external surges as of static charge passable into the input terminal to divert to a reference potential wire.

A further object of the invention is to provide a semiconductor input protection device with a well-type punch-through transistor allowing hardly junction breakdown to occur therein.

A further object of the invention is to provide a semiconductor input protection device with a well-type punch-through transistor of a structure durable at large current density.

A further object of the invention is to provide a semiconductor input protection device with a well-type punch-through transistor allowing hardly punch-through current to flow at the semiconductor substrate interface between the well layers.

A further object of the invention is to provide a semiconductor input protection device with a well-type punch-through transistor well functions without needing increase of input terminal area.

Summary of the Invention

The first embodiment of semiconductor input protection device according to the present invention comprises a well-type punch-through transistor consisting of a pair of parallel-opposed first and second well layers, a first impurity diffusion layer resistance with the first terminal formed in the inside of first well layer and connected to the input terminal and the second terminal formed outside of the first well layer and connected to the internal circuit, a first impurity diffusion layer formed in the second well layer and connected to a wire layer at a reference potential, and channel stoppers formed at distances apart from the first and second well layers. The distance in the vicinity of the intersection of the first well layer and the first impurity diffusion layer resistance between the first impurity diffusion layer and the channel stopper is set to be larger than the spread of the depletion layer in the first well layer at punch-through voltage. When external surge voltage is lower than punch-through voltage, junction breakdown can be caused thereby somewhere apart from the well-type punch-through transistor, thus the function of the well-type punch-through transistor being avoidable to be damaged. The channel stopper extends through the opposed sides of the first and second well layers, and it is prefer that the distances between the channel stopper and the well layers in this area are minimized so far as the junction disruptive strength is not lower than the punch-through voltage. Thus at the semiconductor substrate interface between both well layers, lower punch-through current density results and in turn the interfacial leakage decreases. Besides a high-performance semiconductor input protection device can be realized without needing to increase input terminal area.

Incorporation of a $V_{T2}$ type transistor and a $BV_{DS}$ type transistor in the first embodiment of the present invention brings improvement in input protection performance. Of the $V_{T2}$-type transistor, the gate electrode is connected to the input terminal, the drain to the second terminal of the first impurity diffusion layer resistance, and the source to a wire layer at ground potential. The first terminal of the second impurity diffusion layer resistance is connected to the drain of the $V_{T2}$ transistor. The drain of the $BV_{DS}$-type transistor is connected to the second terminal of the second impurity diffusion layer resistance and to a MOS transistor of the internal circuit. The gate electrode and the source of the $BV_{DS}$-type transistor are connected to a wire layer at ground potential. In this semiconductor input protection device, the well-type punch-through transistor acts to clamp large external surges, and the $V_{T2}$-type an $BV_{DS}$-type transistors does to clamp smaller external surges.

Suitable reference potentials include potentials of the semiconductor substrate, ground and power supply.

The presence of a conducting barrier between the input terminal and the first terminal of the impurity diffusion layer and between a wire layer at a reference potential and the first impurity diffusion layer, respectively, can realize a higher punch-through current threshold of the input terminal and the reference potential wire layer. The conducting barrier films are preferred to consist of at least one selected from the group consisting of polycrystalline silicon film, silicide film and titanium nitride film.

The second embodiment of semiconductor input protection device according to the present invention is provided with a wire layer at a reference potential on the field oxide film between the first and second well layers. This acts as a guard ring effective for preventing the surface leakage of the well-type punch-through transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
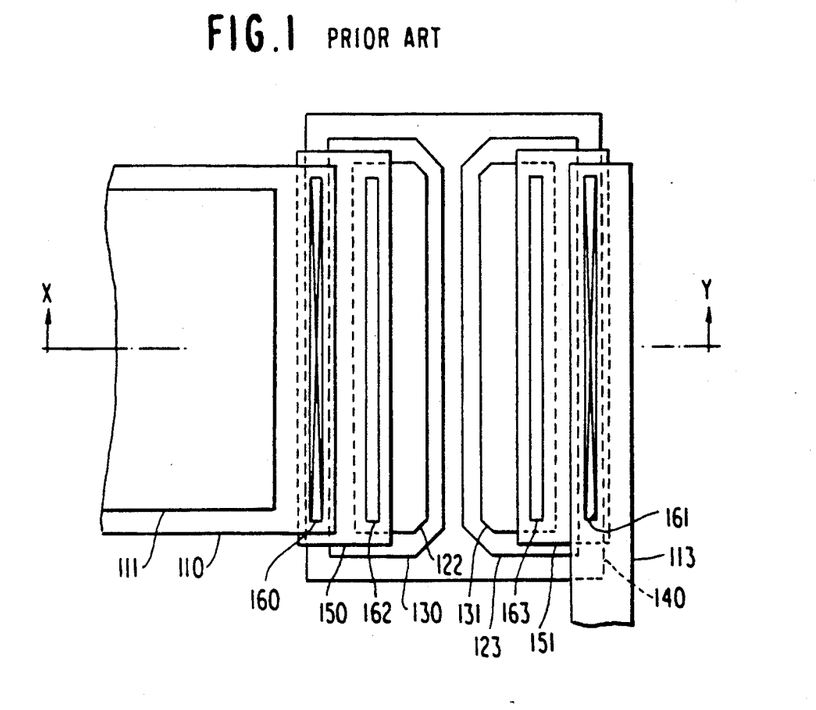
FIG. 1 is a fragmentary plan view of a semiconductor input protection device in the prior art with a well-type punch-through transistor as a protective element.
Figure 2:
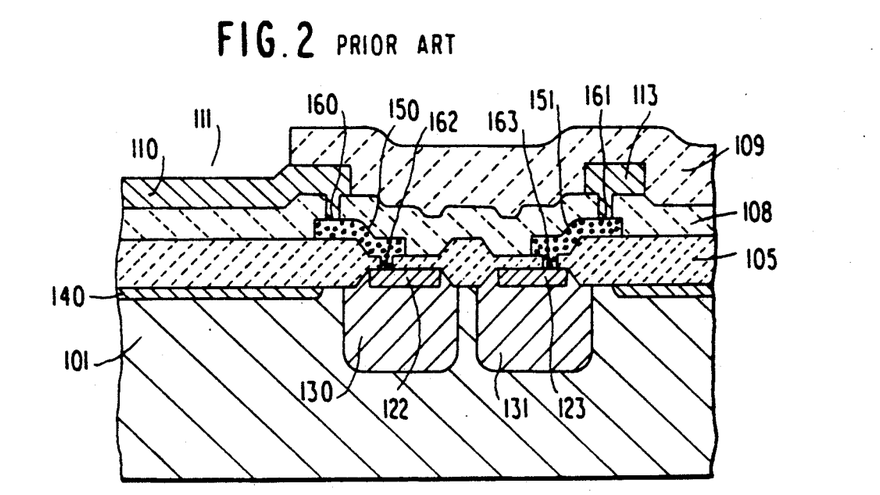
FIG. 2 is a longitudinal sectional view taken along line X-Y in FIG. 1.

Referring to FIGS. 1 and 2, a semiconductor input protection device in the art (Japanese Patent Laid-Open Application No. Hei. 1-194474) with a well-type punch-through transistor will be described below:

The well-type punch-through transistor has a construction which is detailed as follows: a pair of parallel-opposed n-type well layers 130, 131 are formed on the surface of a p-type silicon substrate 101. p-channel stopper 140 is formed just underneath a field oxide film 105 so as to be at substantially fixed distances from n-type well layers 130, 131. In these well layers are formed n+-type impurity diffusion layers 122, 123 in self-alignment with field oxide film 105. There is no intersection between n+-type impurity diffusion layers 122, 123 and p-channel stopper 140. Conducting barrier layers 150, 151 are connected through contact holes 162, 163 to n+-type impurity diffusion layers 122, 123. Conducting barrier films 150, 151 are made from polycrystalline silicon. A bonding pad 110 serving as an input terminal is connected to conducting barrier film 150 through a contact hole 160 in an interlayer insulating film 108. Bonding pad 110 consists as of aluminium film. Interlayer insulating film 108 is made as from BPSG. Wire layer 113 is connected through a contact hole 161 in interlayer insulating film 108 to conducting barrier film 151. Wire layer 113 consists as of an aluminium film and has ground potential or power supply potential. Interlayer insulating film 108, wire layer 113 and the edge portion of the bonding pad 110 are covered with a insulating cover film 109 made as from silicon oxynitride. Bonding pad 110 is provided with a pad through-hole 111 which is formed by etching from insulating cover film 109 on bonding pad 110.

In this known example, channel stoppers 140 are outside of the area between well layers 130 and 131 and thereby punch-through current flows, accompanied by increase in interfacial current leakage.

Besides in this known example, a n+-type impurity diffusion layer resistance (not shown) going to the internal circuit is not connected directly to n+-type impurity diffusion layer 122 but to bonding pad 110 somewhere (not shown in FIG. 1) therein. The area for this connection is necessary.

Figure 3:
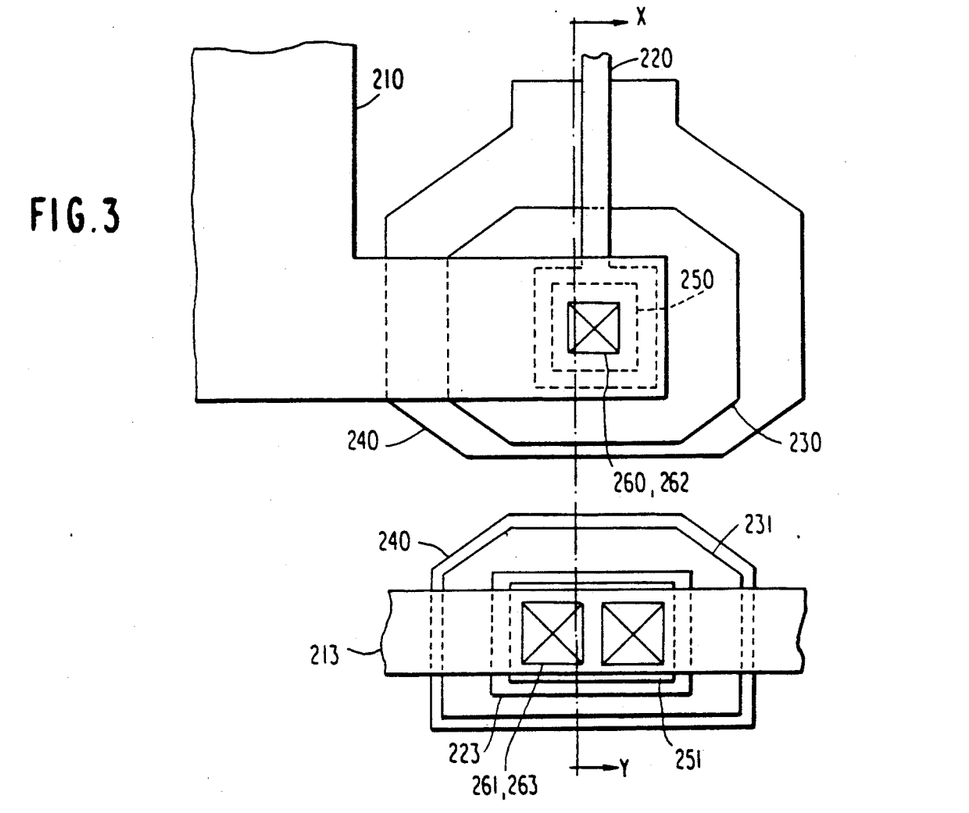
FIG. 3 is a fragmentary plan view illustrating the first embodiment of the present invention.
Figure 4:
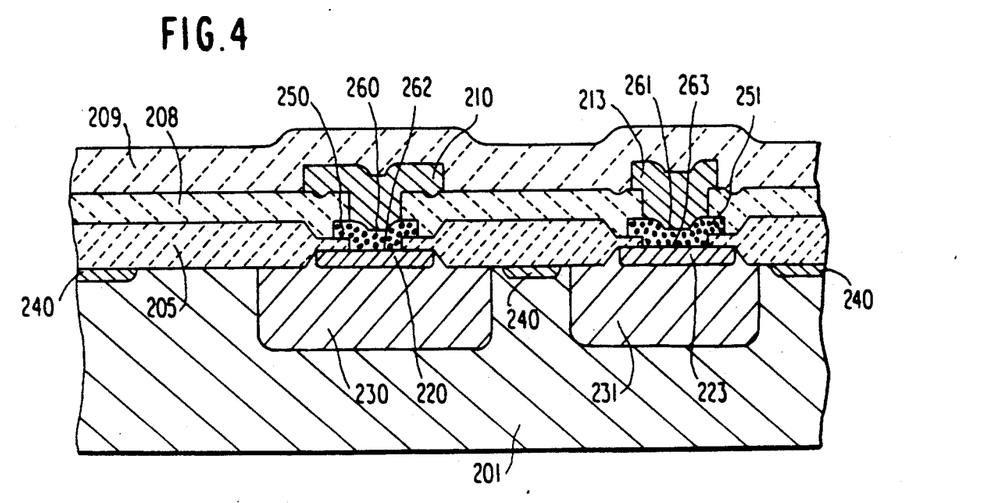
FIG. 4 is a longitudinal sectional view taken along line X-Y in FIG. 3.

The present invention will be fully described with reference to the accompanying drawings hereinafter:

FIGS. 3 and 4 illustrate the first embodiment of the present invention of which the internal circuit is a MOS IC or Bi-CMOS IC.

A pair of parallel-opposed n-type first and second well layers 230, 231 is formed on the surface of p-type silicon substrate 201. The distance between the opposed sides of them is about 20 μm in a mask design. Each portion of impurity diffusion layer resistance 220 including the first and second terminal thereof, respectively, is inside and outside, respectively, of n-type well layer 230. n+-type first impurity diffusion layer 223 is formed in n-type well layer 231. The first impurity diffusion layer resistance 220 and the first impurity diffusion layer 223 are formed in self-alignment with a field oxide film 205. p-channel stopper 240 is formed just underneath field oxide film 205 at distances from n-type well layers 230, 231. There is a distance of 20 μm between p-channel stopper 240 and n-type well layer 230 in the vicinity of the intersection of n-type well 230 and the first impurity diffusion layer resistance 220. The lower limit of this distance depends on the spread of the depletion layer caused by a punch-through voltage applied to n-type well layer 230. In this embodiment, the lower limit is approximately 15 μm. The punch-through voltage in this embodiment is about 50 V. The p-channel stopper 240 extends through the area defined by the opposed sides of n-type well layers 230, 231 and at a distance of about 4 μm from each. The lower limit of these distances is that does not permit the junction disruptive strength (about 50 V in this embodiment) between n-type well layers 230 and p-channel stopper 240 to be lower than the punch-through voltage. In this embodiment, the lower limit is about 3.5 μm. There is no intersection of the first impurity diffusion layer 223 and p-channel stopper 240.

Conducting barrier films 250, 251 are connected through contact holes 262, 263 in the silicon oxide film to a n+-type impurity diffusion resistance 220 and to an impurity diffusion layer 223. These conducting barrier films 250, 251 are effective for preventing junction breakdown due to punch-through current. Without conducting barrier films 250, 251, the wire layer of metal would get heated due to high current-density punch-through current, and molten. As the result, reaction of the molten metal with impurity diffusion layer resistance 220 and silicon of impurity diffusion 223 occures, soon resulting in junction breakdown. Conducting barrier films 250, 251 consist of at least one selected from the group consisting of polycrystalline silicon film, silicide film and titanium nitride film.

A bonding pad 210 serving as an input terminal is connected to a conducting barrier 250 through a contact hole 260 in an interlayer insulating film 208. Bonding pad 210 is made as from aluminium, and interlayer insulating film 208 as from BPSG. A bonding wire 213 is connected to a conducting barrier 251 through a contact hole 261 in an interlayer insulating film 208. Wire layer 213 consists as of aluminium film and is at semiconductor substrate potential, ground potential or power supply potential. Interlayer insulating film 208, bonding pad 210 and wire layer 213 are covered with an insulating cover film 209 which is made as from silicon oxynitride.

Figure 5A:
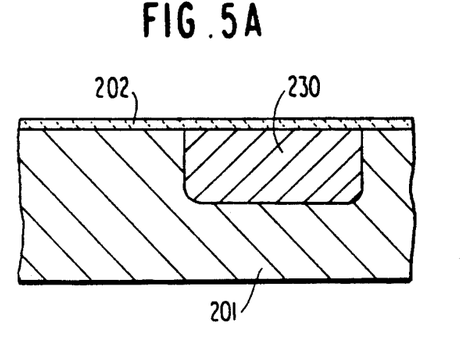
FIGS. 5A to 5F are fragmentary sectional views illustrating in steps the process for fabricating semiconductor input protection device according to the first embodiment of the present invention.

Referring to FIGS. 5A to 5F, a process for fabricating a semiconductor input insulation device according to this embodiment described above, especially n-type first well layer 230 and its surrounding, will be described as an example hereinafter:

In the first step, a silicon oxide film 202 is formed on the surface of p-type silicon substrate 201 of about 1.5 $\Omega$.cm. This formation is effected by thermal oxidation. The resultant film has a about 50 nm. Subsequently a n-type first well layer 230 is formed by ion-implantation of phosphorus with a photoresist film (not shown) as a mask at a dose of approximately $2 \times 10^{13}$ cm$^{-2}$ and at a energy of 150 KeV. After removing the photoresist film, diffusion of the well layer 230 is carried out at 1200° C. to obtain a junction depth of it amounting to about 7 $\mu$m (FIG. 5A).

In the next step, a silicon nitride film 203 is formed on a region of the silicon oxide film 202 where a n$^+$-type impurity diffusion layer and n$^+$-type impurity diffusion layer resistance are to be formed. Then p-channel stopper 240 is formed by ion implantation of boron with a photoresist film 204 as a mask (FIG. 5B) at a dose of approximately $1 \times 10^{13}$ cm$^{-2}$ and at a energy of 100 KeV. In this embodiment, the smaller one (right in FIG. 5B;) of distances from the sides of well layer 230 to channel stopper 240 is 4 $\mu$m and the other (left in FIG. 5B) is 20 $\mu$m, as measured on the mask pattern. The smaller distance is between the channel stopper 240 and the opposite side of well layer 230 to the second well layer. The channel stopper 240 at greater distance from the well layer 230 is parallel to the first impurity diffusion layer resistance to be formed.

Figure 5B:
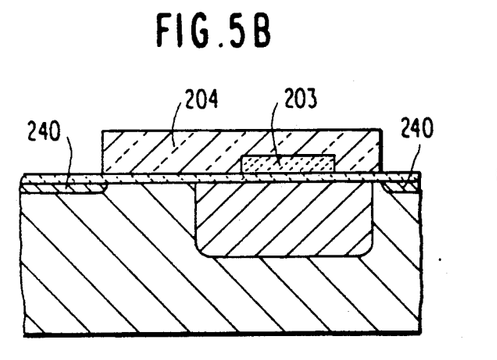

In this embodiment, the lower limit of the smaller distance is 3.5 $\mu$m, then the junction disruptive strength of the well layer being 50 V, the same as the punch-through voltage. Besides increase of this distance reflects increased interfacial leakage of the punch through transistor.

Figure 5C:
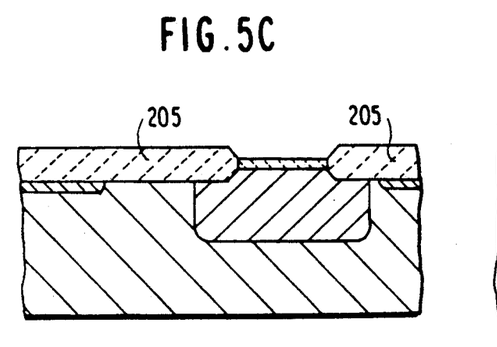

In the next step, the photoresist film is removed, and then a field oxide film 205 is formed by selection oxidation (LOCOS method) with a silicon nitride film 203 as mask. This selection oxidation is carried out in a H$_2$-O$_2$ atmosphere kept at 980° C. The field oxide film 205 is about 650 nm thick. Subsequently the silicon oxide film 203 is removed. (FIG. 5C)

Figure 5D:
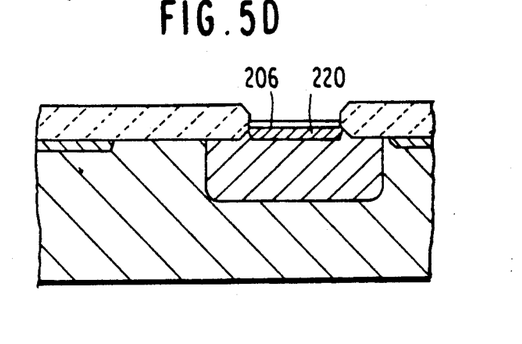

In the next step, the silicon oxide film 202 is etched away. Simultaneously with this, the surface of the field oxiod film 205 is etched to make a thickness of approximately 600 nm. Then a gate oxide film 206 is formed by thermal oxydation to make a thickness of about 20 nm. For example, after forming a N$^+$-type polycrystallin silicon film gate electrode (not shown), ion implantation of phosphorus and arsenic is carried out with the field oxide film 205 as mask to simultaneously form N$^+$-type first impurity diffusion layer resistance 220 and source/drain (not shown) of MOS transistor (FIG. 5D). Ion implantation conditions are dose $5 \times 10^{13}$ cm$^{-2}$ and energy 30 KeV for phosphorus, and dose approximately $5 \times 10^{15}$ cm$^{-2}$ and energy 100 KeV for arsenic.

Figure 5E:
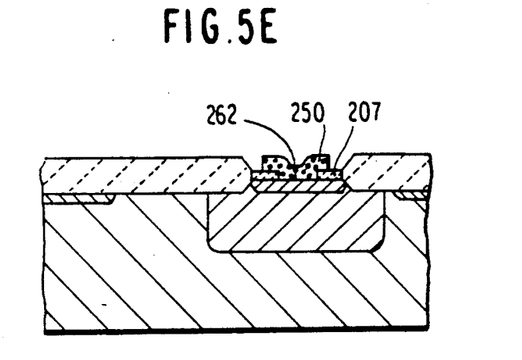

In the next step, thermal oxidation is carried out with gate oxide film 206 left, to form a silicon oxide film 207 on the impurity diffusion layer resistance 220. This thermal oxidation is conducted at 900° C. in O$_2$ atmosphere. The resultant silicon oxide film 207 has a thickness of about 100 nm. Then a contact hole 262 is opened in the silicon oxide film 207. In this contact hole 262, a n$^+$-type polycrystalline silicon film is deposited and processed to form a conducting barrier film 250 to be connected to the first impurity diffusion layer 220 (FIG. 5E). The conducting barrier film 250 has a thickness of about 300 nm.

Figure 5F:
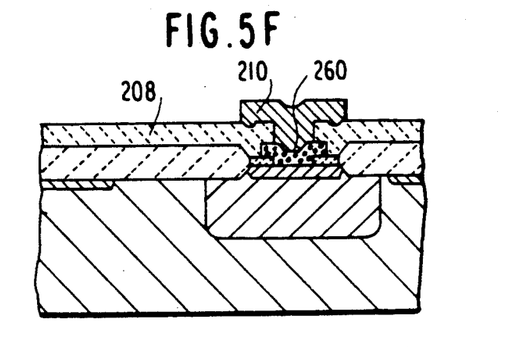

For example, an interlayer insulating film 208 made as from BPSG is deposited to make a thickness of about 600 nm. In the interlayer insulating film 208 on the conducting barrier film 250, a contact hole 260 is opened. Subsequently for example, by depositing aluminium film containing silicon at about 1% to a thickness of 1.1 $\mu$m in the contact hole 260 and process it to form a bonding pad 210 to be connected to the conducting barrier film 250 (FIG. 5F). Thereafter, for example, silicon oxynitride is deposited onto the bonding pad 210 to form an insulating-film cover of about 1 $\mu$m thick, in which then a pad-through hole is opened. In this way, fabrication of the semiconductor input protection device in this embodiment has been completed.

Figure 6:
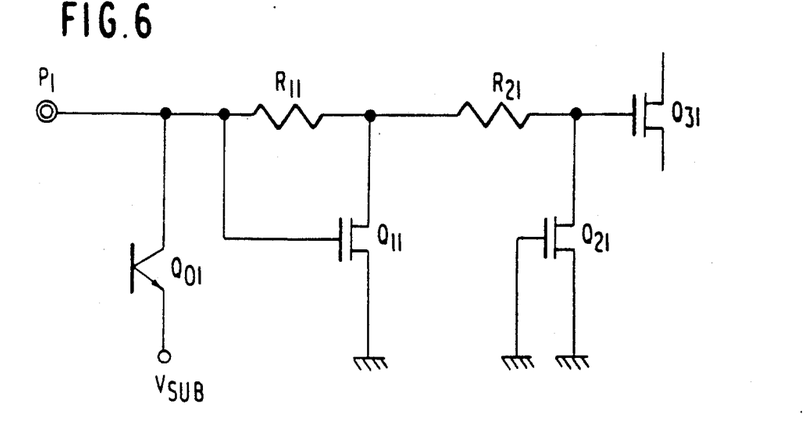
FIG. 6 is a circuit diagram of an example (application example) to which the first embodiment of the present invention is applied.
Figure 7:
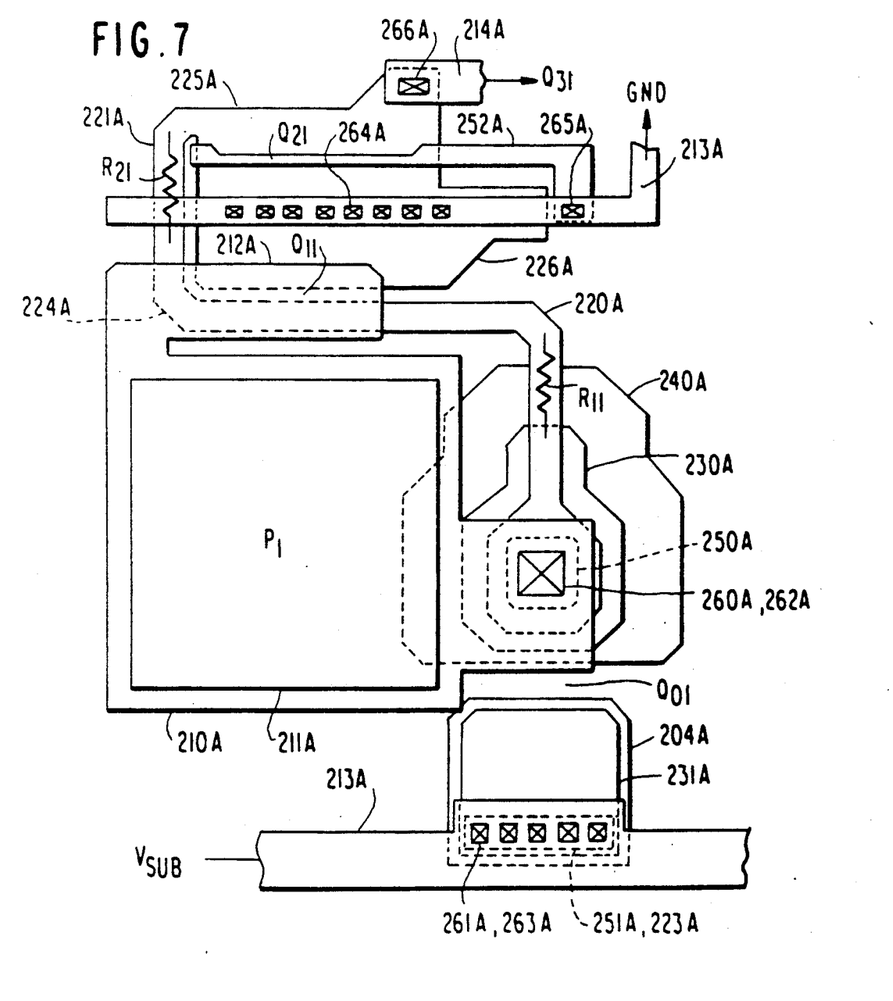
FIG. 7 is a plan view illustrating the application example.

Referring to FIGS. 6 and 7, an example with additional protective elements, to which the first embodiment according to the invention is applied, (referred to as application example hereinafter) will be described below:

The protective elements in this application example include a well-type punch-through transistor $Q_{01}$, a $V_{T2}$-type transistor $Q_{11}$, a BV$_{DS}$-type transistor $Q_{21}$, a first input protection resistance $R_{11}$ and a second input protection resistance $R_{21}$. A transistor $Q_{31}$ is an internal circuit MOS transistor, and $P_1$ is an input terminal.

The punch-through voltage of $Q_{01}$ is about 50 V. W(gate width)/L(gate length) of $Q_{11}$ is 64 (in $\mu$m)/4.5 (in $\mu$m) and gets conductive at about 15 V. W/L of $Q_{21}$ is 80/3.0 and gets conductive similarly at about 15 V. $R_{11}$ and $R_{21}$ have resistances of 560 $\Omega$ and 870 $\Omega$, respectively.

$P_1$, a boding pad 210A, is connected to a bonding wire (not shown) through a pad-through hole 211A thereon. $R_{11}$ and $R_{21}$ are a n$^+$-type first impurity diffusion layer resistance 220A and n$^+$-type second impurity diffusion layer resistance 221A, respectively. Each has a junction disruptive strength of about 20 V.

The first terminal of $R_{11}$ is connected to the input terminal $P_1$ (bonding pad 210A) through a contact hole 262A, a conducting barrier film 250A and another contact hole 260A. The n-type first well layer 230A of $Q_{01}$ is formed in the area including the first terminal of $R_{11}$ and connected through this terminal to the input terminal $P_1$. In n$^+$-type second well layer 231A of $Q_{01}$, a n$^+$-type first impurity diffusion layer 223A is formed. The second well layer 231A is connected to a wire layer 213A through a first impurity diffusion layer 223A, a contact hole 263A, a conducting barrier film 251A and another contact hole 261A. The wire layer 213A is at the substrate potential ($V_{sub}$). The distance between the first well layer 230A and the second well layer 231A is 20 μm. The distances from first well layer 230A and from second well layer 231A to p-type channel stopper 240A are each 4 μm. The distance from the first well layer 230A to the channel stopper 240 except the side thereof opposed to the second well layer 231A is about 20 μm.

n+-type impurity diffusion layer 224A, a drain of $Q_{11}$, is connected to the second terminal of $R_{11}$ and to the first terminal of $R_{21}$. The gate electrode of $Q_{11}$, an aluminium gate electrode 212A, is formed on the interlayer insulating film and connected to input terminal $P_1$ (bonding pad 210A). A n+-type fourth impurity diffusion layer 226A acting as a common source of $Q_{11}$ and $Q_{21}$ is connected through a contact hole 264A to wire layer 213A at the ground potential (GND). n+-type third impurity diffusion layer 225A acting as a drain of $Q_{21}$ is connected to the second terminal of $R_{21}$. It is connected through contact hole 266A to wire layer 214A which in turn is connected to the gate electrode of $Q_{31}$. Wire layers 213A and 214A together with bonding pad 210A and wire layer 211A are formed simultaneously. Gate electrode 252A of $Q_{21}$ consisting as of n+-type polycrystalline silicon film is connected through contact hole 265A to wire layer 213A.

In this application example, when external surge voltage exceeds 15 V, $Q_{11}$ and $Q_{12}$ being to take effect. When it exceeds 20 V, $R_{11}$ and $R_{21}$ serve as the aid of their effect. At surge voltages exceeding 50 V, $Q_{01}$ is mainly effective.

When the voltage at which $Q_{11}$ and $Q_{12}$ become conductive is set to a value of the junction disruptive strength of $R_{11}$ and $R_{21}$ or higher, $R_{11}$ and $R_{21}$ are mainly effective against external surge, and thus the presence of $Q_{11}$ and $Q_{21}$ becomes insignificant.

Figure 8:
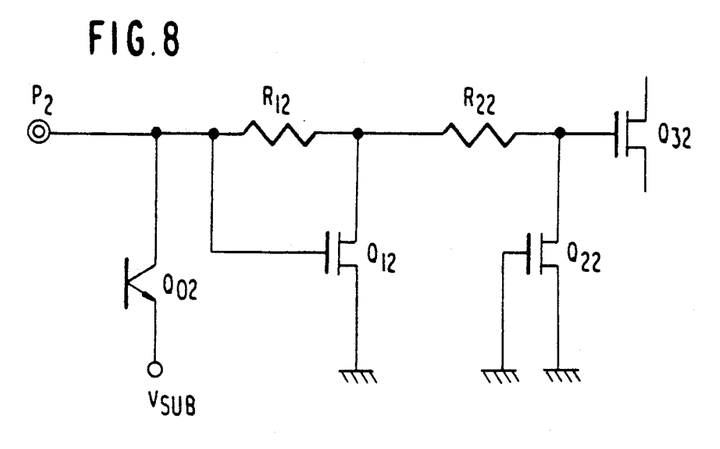
FIG. 8 is a circuit diagram of a comparative example for illustrating the effect of the application example.
Figure 9:
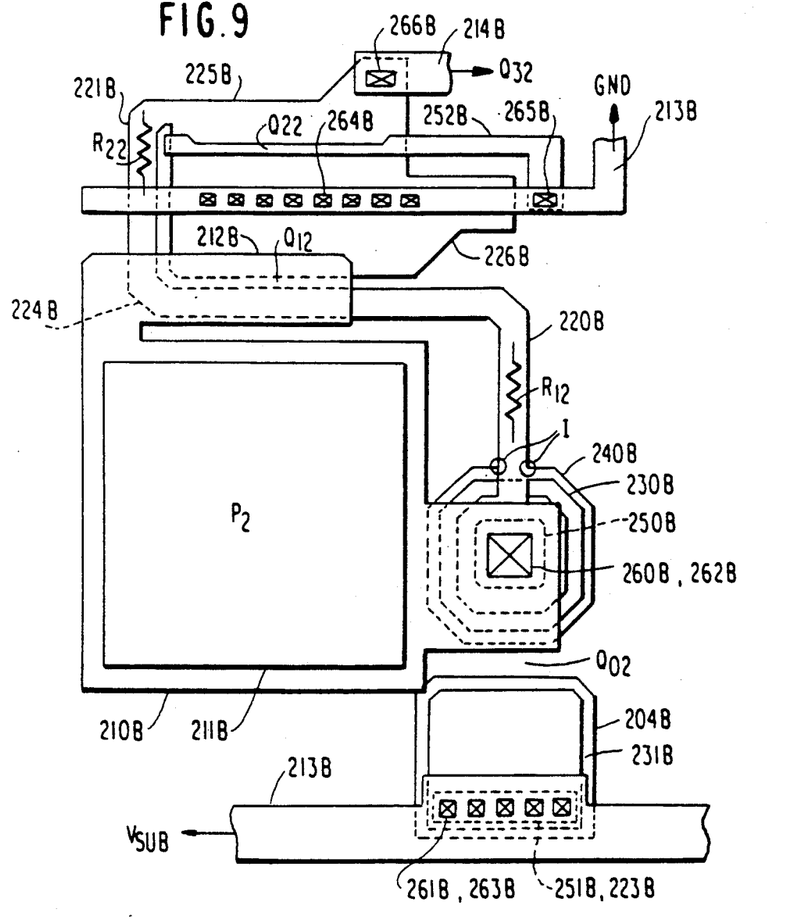
FIG. 9 is a plan view of the comparative example.

FIGS. 8 and 9 illustrates an alternative of the above-mentioned application example (referred to as comparative example hereinafter) which has a modified distance between the first well and the channel stopper. Comparison between the application example and this comparative example will make apparent the effect of the first embodiment of the present invention.

This comparative example has the following construction:

The protective components in this comparative example include a well-type punch-through transistor $Q_{02}$, a $V_{T2}$-type transistor $Q_{12}$, a $BV_{DS}$-type transistor $Q_{22}$, a first input protection resistance $R_{12}$ and a second input protection resistance $R_{22}$. A transistor $Q_{32}$ is an internal circuit MOS transistor and $P_2$ is an input terminal.

The punch-through voltage of $Q_{02}$ is about 50 V. W/L of $Q_{12}$ is 64 (in μm)/4.5 (in μm) and gets conductive at about 15 V. W/L of $Q_{22}$ is 80/3.0 and gets conductive similarly at about 15 V. $R_{12}$ and $R_{22}$ have resistance of 460 Ω and 870 Ω, respectively.

$P_2$, a boding pad 210B, is connected to a bonding wire (not shown) through a pad-through hole 211B thereon. $R_{12}$ and $R_{22}$ are a n+-type first impurity diffusion layer resistance 220B and n+-type second impurity diffusion layer resistance 221B, respectively. Each has a junction disruptive strength of about 20 V.

The first terminal of $R_{12}$ is connected to the input terminal $P_2$ (bonding pad 210B) through a contact hole 262B, a conducting barrier film 250B and another contact hole 260B. The n-type first well layer 230B of $Q_{02}$ is formed in the area including the first terminal of $R_{12}$ and connected through this terminal to the input terminal $P_2$. In n+-type second well layer 231B of $Q_{02}$, a n+-type first impurity diffusion layer 223B is formed. The second well layer 231B is connected to a wire layer 213B through a first impurity diffusion layer 223B, a contact hole 263B, a conducting barrier film 251B and another contact hole 261B. The wire layer 213B is at the substrate potential ($V_{sub}$). The distance between the first well layer 230B and the second well layer 231B is 20 μm. The distances from first well layer 230B and from second well layer 231B to p-type channel stopper 240B are each 4 μm.

n+-type second impurity diffusion layer 224B, a drain of $Q_{12}$, is connected to the second terminal of $R_{12}$ and to the first terminal of $R_{22}$. The gate electrode of $Q_{12}$, an aluminium gate electrode 212B, is formed on the interlayer insulating film and connected to input terminal $P_2$ (bonding pad 210B). A n+-type fourth impurity diffusion layer 226B acting as a common source of $Q_{12}$ and $Q_{22}$ is connected through a contact hole 264B to wire layer 213B at the ground potential (GND). n+-type third impurity diffusion layer 225B acting as a drain of $Q_{22}$ is connected to the second terminal of $R_{22}$. It is connected through contact hole 266B to wire layer 214B which in turn is connected to the gate electrode of $Q_{32}$. Wire layers 213B and 214B together with bonding pad 210B and wire layer 211B are formed simultaneously. Gate electrode 252B of $Q_{22}$ consisting as of n+-type polycrystalline silicon film is connected through contact hole 265B to wire layer 213B.

In this comparative example, junction disruptive strengths of n+-type first impurity diffusion layer 223B only and p-type channel stopper 240B are each 20 V, and the junction disruptive strength at the point I indicated in FIG. 9 is about 17±3 V, and therefore junction breakdown may occur firstly at this point. The cause of such lowered junction breakdown voltage at point I is as follows: the junction depth of the first well layer 230B is about 7 μm, and accordingly the lateral spread of it is about 5 μm. Thus at the point I, the concentration of the n-type impurity is somewhat higher than in the case of only impurity of the impurity diffusion layer 223B, resulting in the lowered junction disruptive strength at this point I. When junction disruptive strength at point I is up to 15 V, junction breakdown would be caused firstly at this point by external surge. Once this is caused, hot carriers generated thereby are injected into the insulating film to form leakage path, with the result of making ineffective the functions of protective components $Q_{02}$, $Q_{12}$, $Q_{22}$, $R_{12}$ and $R_{22}$.

In other words, with protective elements ($Q_{12}$, $Q_{22}$) having effect on external surge voltage lower than the junction disruptive strength of n+-type first impurity diffusion layer 223B, if the lateral spread of first well layer 230B is spaced apart from p-channel stopper 240B, (for example, if the distance between point I and first well layer 230B is more than 5 μm), then these protective elements function before junction breakdown is caused by external surge.

Without protective elements having effect on external surge voltage lower than the junction disruptive strength, however, it must be avoided that hot carriers resulting from junction breakdown are injected directly into a well-type punch-through transistor. This can be achieved by preventing the depletion layer of the well layer at the punch-through electrode of the well-type punch through transistor from reaching to point I. (In the first embodiment of the present invention, it may be 15 μm or more.)

The results of tests for reliability based on the MILSTD883C 3015.2 Electrostatic Discharge Sensitivity Classification with the application example and the comparative example mentioned above are as follows:

Rates of occurrence of DC leakage of 1 μA or more were 0/400 at ±2000 V both across the $P_1$ (input terminal)-$V_{cc}$ and the $P_1$-GND for the application example and 160/200 and 100/200 at +1500 V across the $P_2$ (input terminal)-$V_{cc}$ and −2000 V across the $P_2$-GND, respectively, for the comparative example.

Figure 10:
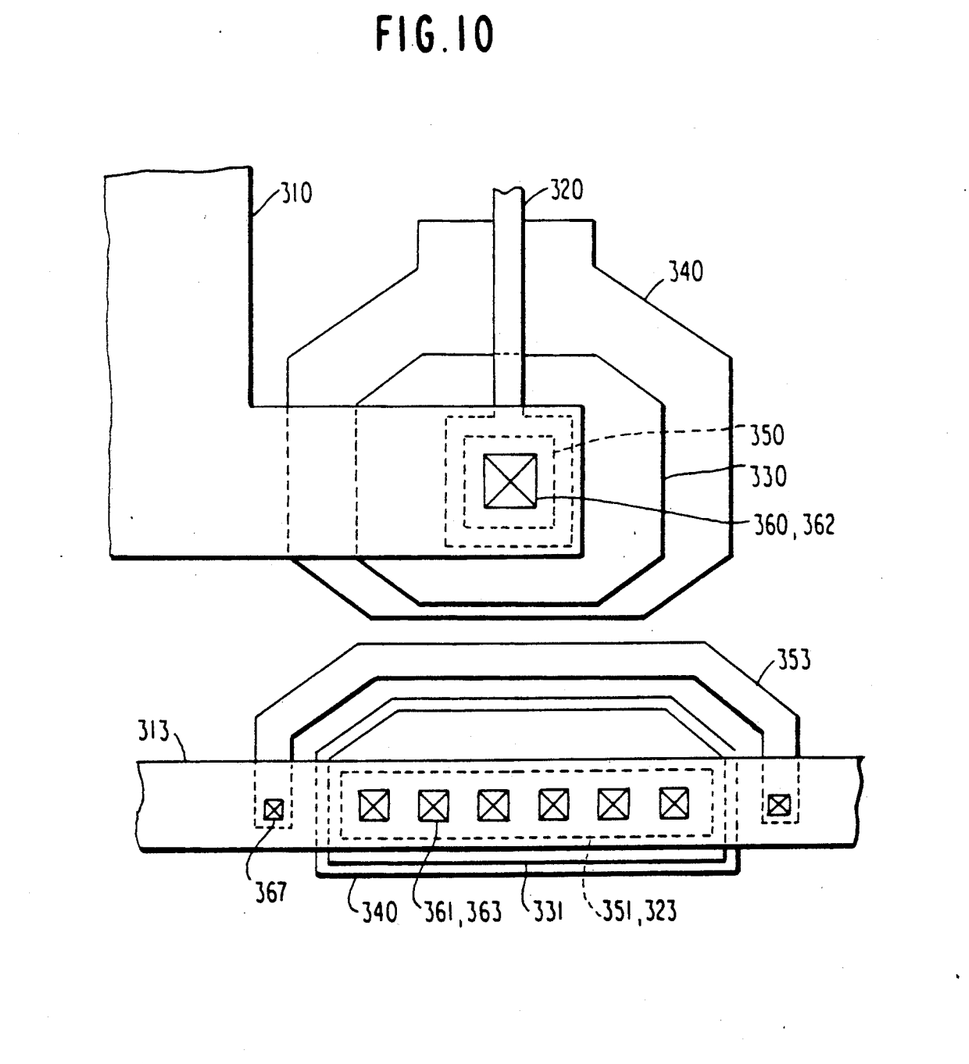
FIG. 10 is a fragmentary plan view illustrating the second embodiment of the present invention.

Referring to FIG. 10 will be detailed the second embodiment of the present invention which is the same as the first embodiment of the present invention except that there is further provided a guard ring electrode 353.

A pair of n-type first and second well layers 330, 331 opposed in a parallel way (at the same distance apart) are formed on the surface of a p-type silicon substrate (not shown). The distance between both is about 20 μm in a mask design. Each portion of the first impurity diffusion layer resistance 320 including the first terminal and second terminal, respectively, is inside and outside, respectively, of n-type well layer 330. n+-type first impurity diffusion layer 323 is formed in n-type well layer 331. The first impurity diffusion layer resistance 320 and first impurity diffusion layer 323 are formed in self-alignment with a field oxide film (not shown). p-channel stopper 340 is formed just underneath field oxide film 305 at distances from n-type well layers 330, 331. In the vicinity of the intersection of n-type well 330 and the first impurity diffusion layer resistance 320, the distance between the p-channel stopper 340 and n-type well layer 330 is 20 μm. The lower limit value of this distance is determined by spread of the depletion layer when a punch-through voltage is applied to n-type well layer 330, and approximately 15 μm in this embodiment. The punch-through voltage in this embodiment is about 50 V. Between the opposed sides of n-type well layers 330, 33, the p-channel stopper 340 formed there is at a distance of 4 μm. apart from each n-type well. The lower limit values of these distances are determined so as not to permit the junction disruptive strengths (about 50 V in this embodiment) of n-type well layers 330 and p-channel stopper 340 to be lower than the punch-through voltage. In this embodiment, they are about 3.5 μm. There is no intersection of first impurity diffusion layer 323 and p-channel stopper 340.

Conducting barrier films 350, 351 are connected through contact holes 362, 363, respectively, in the silicon oxide film to a n+-type impurity diffusion resistance 320 and to an impurity diffusion layer 323, respectively. These conducting barrier films 350, 351 are effective for preventing junction breakdown due to punch-through current. Without conducting barrier films 350, 351, punch-through current of high current-density would cause the wire layers to get heated. The resultant molten metal of the wire layers would react with impurity diffusion layer resistance 320 and silicon of impurity diffusion 323, soon going to junction breakdown. Conducting barrier films 350, 351 may consist of at least one selected from the group consisting of polycrystalline silicon film, silicide film and titanium nitride film.

A bonding pad 310 serving as an input terminal is connected to a conducting barrier 350 through a contact hole 360 in an interlayer insulating film 308. Bonding pad 310 is made as from aluminium and interlayer insulating film 308 as from BPSG. There is provided a wire layer 313 connected to a conducting barrier 351 through a contact hole 361 in an interlayer insulating film 308. Connection 313 which consists as of aluminium film has the semiconductor substrate potential, ground potential or power supply potential. Interlayer insulating film (not shown), bonding pad (not shown) and wire layer 313 are covered with an insulating-film cover 309 which is made as from silicon oxynitride.

A guard ring electrode 353 consisting as of n+-type polycrystalline silicon film is formed on the portion of p-channel stopper 340 between the opposed sides of n-type well layers 330, 331 and through the field oxide film, and connected through a contact hole 367 to wire layer 3 13.

This embodiment is effective for preventing with high reliability interface leakage in the well-type punch-through transistor compared with the first embodiment.

Besides with omission of opening contact hole 367, guard ring electrode 353 may be made from the same material as connection 313 on the interface insulating film in the same processing step.

Although the invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor input protection device annexed to a semiconductor device formed on the surface of a one-conductivity type semiconductor substrate comprising an opposite-conductivity type first impurity diffusion layer resistance with one end thereof connected to an input terminal, an opposite-conductivity first type impurity diffusion layer connected through a wire layer at a reference potential, a field oxide film for separating elements on the surface of said semiconductor substrate between said first impurity diffusion layer resistance and said first impurity diffusion layer, an opposite-conductivity type first well layer containing the area of said first impurity diffusion resistance including said end thereof, an opposite-conductivity type second well layer containing said first impurity diffusion layer and parallel-opposed to said first well layer underneath said field oxide film, a well-type punch-through transistor including said first well layer and said second well layer, and a one-conductivity type channel stopper formed on the portions the surface of said semiconductor substrate surrounding said first well layer and said second well layer and at distance apart from said first well layer and said second well layer, wherein the distances between said channel stopper and the opposed side of said first well layer to said second well layer and between said channel stopper and said second well layer have each a first lower limit value as the permissible smallest value, and said distance from said channel stopper at least in the area where said first well layer and said first impurity diffusion layer resistance intersect has a second lower limit distance greater than said first lower limit value.

2. A semiconductor input protection device as claimed in claim 1 wherein the connection between said one end of said first impurity diffusion layer resistance and said to said input, and the connection between said first impurity diffusion layer and said wire layer at said reference potential are each completed through a conducting barrier film.

3. A semiconductor input protection device as claimed in claim 2 wherein said conducting barrier film consists of at least one selected from the group consisting of polycrystalline silicon film, silicide film and titanium nitride film, each thereof containing a conducting impurity added thereto.

4. A semiconductor input protection device as claimed in claim 1 wherein the junction disruptive strengths of said first and second well layers determined by said first lower limit value are greater than the punch-through voltage of said well-type punch-through transistor.

5. A semiconductor input protection device as claimed in claim 2 wherein the junction disruptive strengths of said first and second well layers determined by said first lower limit value are greater than the punch-through voltage of said well-type punch-through transistor.

6. A semiconductor input protection device as claimed in claim 3 wherein the junction disruptive strengths of said first and second well layers determined by said first lower limit value are greater than the punch-through voltage of said well-type punch-through transistor.

7. A semiconductor input protection device as claimed in claim 1 wherein said second limit value is greater than the width of the depletion layer at the punch-through voltage of said well-type punch-through transistor in said first well layer.

8. A semiconductor input protection device as claimed in claim 2 wherein said second limit value is greater than the width of the depletion layer at the punch-through voltage of said well-type punch-through transistor in said first well layer.

9. A semiconductor input protection device as claimed in claim 3 wherein said second limit value is greater than the width of the depletion layer at the punch-through voltage of said well-type punch-through transistor in said first well layer.

10. A semiconductor input protection device as claimed in claim 4 wherein said second limit value is greater than the width of the depletion layer at the punch-through voltage of said well-type punch-through transistor in said first well layer.

11. A semiconductor input protection device as claimed in claim 5 wherein said second limit value is greater than the width of the depletion layer at the punch-through voltage of said well-type punch-through transistor in said first well layer.

12. A semiconductor input protection device as claimed in claim 6 wherein said second limit value is greater than the width of the depletion layer at the punch-through voltage of said well-type punch-through transistor in said first well layer.

13. A semiconductor input protection device as claimed in claim 1 further comprising a guard ring electrode connected to said wire layer at said reference potential and provided above said channel stopper through the intermediation of said field oxide film in the area defined by the parallel-opposed sides of said first and second well layers.

14. A semiconductor input protection device as claimed in claim 2 further comprising a guard ring electrode connected to said wire layer at said reference potential and provided above said channel stopper through the intermediation of said field oxide film in the area defined by the parallel-opposed sides of said first and second well layers.

15. A semiconductor input protection device as claimed in claim 3 further comprising a guard ring electrode connected to said wire layer at said reference potential and provided above said channel stopper through the intermediation of said field oxide film in the area defined by the parallel-opposed sides of said first and second well layers.

16. A semiconductor input protection device as claimed in claim 4 further comprising a guard ring electrode connected to said wire layer at said reference potential and provided above said channel stopper through the intermediation of said field oxide film in the area defined by the parallel-opposed sides of said first and second well layers.

17. A semiconductor input protection device as claimed in claim 5 further comprising a guard ring electrode connected to said wire layer at said reference potential and provided above said channel stopper through the intermediation of said field oxide film in the area defined by the parallel-opposed sides of said first and second well layers.

18. A semiconductor input protection device as claimed in claim 6 further comprising a guard ring electrode connected to said wire layer at said reference potential and provided above said channel stopper through the intermediation of said field oxide film in the area defined by the parallel-opposed sides of said first and second well layers.

19. A semiconductor input protection device as claimed in claim 7 further comprising a guard ring electrode connected to said wire layer at said reference potential and provided above said channel stopper through the intermediation of said field oxide film in the area defined by the parallel-opposed sides of said first and second well layers.

20. A semiconductor input protection device as claimed in claim 8 further comprising a guard ring electrode connected to said wire layer at said reference potential and provided above said channel stopper through the intermediation of said field oxide film in the area defined by the parallel-opposed sides of said first and second well layers.

21. A semiconductor input protection device as claimed in claim 9 further comprising a guard ring electrode connected to said wire layer at said reference potential and provided above said channel stopper through the intermediation of said field oxide film in the area defined by the parallel-opposed sides of said first and second well layers.

22. A semiconductor input protection device as claimed in claim 10 further comprising a guard ring electrode connected to said wire layer at said reference potential and provided above said channel stopper through the intermediation of said field oxide film in the area defined by the parallel-opposed sides of said first and second well layers.

23. A semiconductor input protection device as claimed in claim 11 further comprising a guard ring electrode connected to said wire layer at said reference potential and provided above said channel stopper through the intermediation of said field oxide film in the area defined by the parallel-opposed sides of said first and second well layers.

24. A semiconductor input protection device as claimed in claim 12 further comprising a guard ring electrode connected to said wire layer at said reference potential and provided above said channel stopper through the intermediation of said field oxide film in the area defined by the parallel-opposed sides of said first and second well layers.

25. A semiconductor input protection device annexed to a semiconductor device formed on the surface of a one-conductivity type semiconductor substrate comprising an opposite-conductivity type first impurity diffusion layer resistance with the first terminal thereof connected to an input terminal, an opposite-conductivity type first impurity diffusion layer connected through a wire layer at a reference potential, a field oxide film for separating elements on the surface of said semiconductor substrate between said first impurity diffusion layer resistance and said first impurity diffusion layer, a gate electrode connected to the ground potential, an opposite-conductivity type second impurity diffusion layer connected to the second terminal of said first impurity diffusion layer resistance, an opposite-conductivity type second impurity diffusion layer resistance with the first terminal connected to said second impurity diffusion layer, an opposite-conductivity type third impurity diffusion layer connected to the second terminal of said second impurity diffusion layer resistance and to a wire layer going to the internal circuit, an opposite-conductivity type fourth impurity diffusion layer connected to said ground potential, and opposed to said third impurity diffusion layer through intermediation of a gate insulating film and said gate electrode connected to said ground potential, and to said first impurity diffusion layer through intermediation of said field oxide film, another gate electrode connected to said input terminal, and covering at least a part of said field oxide film between said first impurity diffusion and said fourth impurity diffusion layer, an opposite-conductivity type first well layer containing a portion of said first impurity diffusion resistance including said first terminal, an opposite-conductivity type second well layer containing said first impurity diffusion layer, and parallel-opposed to said first well layer underneath said field oxide film, a well-type punch-through transistor including said first well layer and said second well layer, and a one-conductivity type channel stopper formed on the surface areas of said semiconductor substrate surrounding said first well layer and said second well layer, wherein said channel stopper being at distances from said first well layer and said second well layer, said distances in the opposed area of said first well layer to said second well layer and in said second well layer have each a first lower limit value as the permissible smallest value, and said distance at least in the area where said first well layer and said first impurity diffusion layer resistance intersect has a second lower limit distance greater than said first lower limit value.

26. A semiconductor input protection device as claimed in claim 25 wherein the connection between said one end of said first impurity diffusion layer resistance and said to said input, and the connection between said first impurity diffusion layer and said wire layer at said reference potential are each completed through a conducting barrier film.

27. A semiconductor input protection device as claimed in claim 26 wherein said conducting barrier film consists of at least one selected from the group consisting of polycrystalline silicon film, silicide film and titanium nitride film, each thereof containing a conducting impurity added thereto.

28. A semiconductor input protection device as claimed in claim 25 wherein the junction disruptive strengths of said first and second well layers determined by said first lower limit value are greater than the punch-through voltage of said well-type punch-through transistor.

29. A semiconductor input protection device as claimed in claim 26 wherein the junction disruptive strengths of said first and second well layers determined by said first lower limit value are greater than the punch-through voltage of said well-type punch-through transistor.

30. A semiconductor input protection device as claimed in claim 27 wherein the junction disruptive strengths of said first and second well layers determined by said first lower limit value are greater than the punch-through voltage of said well-type punch-through transistor.

31. A semiconductor input protection device as claimed in claim 25 wherein said second lower limit value is greater than the lateral well-layer spread value in said first well layer.

32. A semiconductor input protection device as claimed in claim 26 wherein said second lower limit value is greater than the lateral well-layer spread value in said first well layer.

33. A semiconductor input protection device as claimed in claim 27 wherein said second lower limit value is greater than the lateral well-layer spread value in said first well layer.

34. A semiconductor input protection device as claimed in claim 28 wherein said second lower limit value is greater than the lateral well-layer spread value in said first well layer.

35. A semiconductor input protection device as claimed in claim 29 wherein said second lower limit value is greater than the lateral well-layer spread value in said first well layer.

36. A semiconductor input protection device as claimed in claim 30 wherein said second lower limit value is greater than the lateral well-layer spread value in said first well layer.

37. A semiconductor input protection device as claimed in claim 25 further comprising a guard ring electrode connected to said wire layer at said reference potential and provided above said channel stopper through the intermediation of said field oxide film in the area defined by the parallel-opposed sides of said first and second well layers.

38. A semiconductor input protection device as claimed in claim 26 further comprising a guard ring electrode connected to said wire layer at said reference potential and provided above said channel stopper through the intermediation of said field oxide film in the area defined by the parallel-opposed sides of said first and second well layers.

39. A semiconductor input protection device as claimed in claim 27 further comprising a guard ring electrode connected to said wire layer at said reference potential and provided above said channel stopper through the intermediation of said field oxide film in the area defined by the parallel-opposed sides of said first and second well layers.

40. A semiconductor input protection device as claimed in claim 28 further comprising a guard ring electrode connected to said wire layer at said reference potential and provided above said channel stopper through the intermediation of said field oxide film in the area defined by the parallel-opposed sides of said first and second well layers.

41. A semiconductor input protection device as claimed in claim 29 further comprising a guard ring electrode connected to said wire layer at said reference potential and provided above said channel stopper through the intermediation of said field oxide film in the area defined by the parallel-opposed sides of said first and second well layers.

42. A semiconductor input protection device as claimed in claim 30 further comprising a guard ring electrode connected to said wire layer at said reference potential and provided above said channel stopper through the intermediation of said field oxide film in the area defined by the parallel-opposed sides of said first and second well layers.

43. A semiconductor input protection device as claimed in claim 31 further comprising a guard ring electrode connected to said wire layer at said reference potential and provided above said channel stopper through the intermediation of said field oxide film in the area defined by the parallel-opposed sides of said first and second well layers.

44. A semiconductor input protection device as claimed in claim 32 further comprising a guard ring electrode connected to said wire layer at said reference potential and provided above said channel stopper through the intermediation of said field oxide film in the area defined by the parallel-opposed sides of said first and second well layers.

45. A semiconductor input protection device as claimed in claim 33 further comprising a guard ring electrode connected to said wire layer at said reference potential and provided above said channel stopper through the intermediation of said field oxide film in the area defined by the parallel-opposed sides of said first and second well layers.

46. A semiconductor input protection device as claimed in claim 34 further comprising a guard ring electrode connected to said wire layer at said reference potential and provided above said channel stopper through the intermediation of said field oxide film in the area defined by the parallel-opposed sides of said first and second well layers.

47. A semiconductor input protection device as claimed in claim 35 further comprising a guard ring electrode connected to said wire layer at said reference potential and provided above said channel stopper through the intermediation of said field oxide film in the area defined by the parallel-opposed sides of said first and second well layers.

48. A semiconductor input protection device as claimed in claim 36 further comprising a guard ring electrode connected to said wire layer at said reference potential and provided above said channel stopper through the intermediation of said field oxide film in the area defined by the parallel-opposed sides of said first and second well layers.

* * * * *